United States Patent
Jones et al.

(10) Patent No.: US 9,076,702 B2
(45) Date of Patent: Jul. 7, 2015

(54) FRONTSIDE-ILLUMINATED BARRIER INFRARED PHOTODETECTOR DEVICE AND METHODS OF FABRICATING THE SAME

(71) Applicant: L-3 Communications Cincinnati Electronics Corporation, Mason, OH (US)

(72) Inventors: Robert A. Jones, Cincinnati, OH (US); David P. Forrai, Centerville, OH (US); Richard L. Rawe, Jr., Melbourne, KY (US)

(73) Assignee: L-3 Communications Cincinnati Electronics Corporation, Mason, OH (US)

( * ) Notice: Subject to any disclaimer, the term of this patent is extended or adjusted under 35 U.S.C. 154(b) by 0 days.

(21) Appl. No.: 14/463,775

(22) Filed: Aug. 20, 2014

(65) Prior Publication Data
US 2014/0353585 A1    Dec. 4, 2014

Related U.S. Application Data

(62) Division of application No. 13/614,433, filed on Sep. 13, 2012, now Pat. No. 8,846,432.

(60) Provisional application No. 61/534,184, filed on Sep. 13, 2011.

(51) Int. Cl.
*H01L 27/146* (2006.01)
*H01L 31/02* (2006.01)
(Continued)

(52) U.S. Cl.
CPC .......... *H01L 27/146* (2013.01); *H01L 27/1467* (2013.01); *H01L 27/14634* (2013.01);
(Continued)

(58) Field of Classification Search
CPC ......... H01L 24/00–24/99; H01L 25/00–25/50; H01L 27/00–27/14893; H01L 31/0203; Y02E 10/544

USPC ............ 438/48–98, 64, 66, 67; 257/428–466, 257/E31.11
See application file for complete search history.

(56) References Cited

U.S. PATENT DOCUMENTS

| | | |
|---|---|---|
| 4,679,063 A | 7/1987 | White |
| 4,695,861 A | 9/1987 | Paine et al. |

(Continued)

FOREIGN PATENT DOCUMENTS

| | | |
|---|---|---|
| EP | 0071497 A1 | 2/1983 |
| EP | 0485115 | 5/1992 |

(Continued)

OTHER PUBLICATIONS

International Search Report and Written Opinion dated Jan. 17, 2013 pertaining to International Application No. PCT/US2012/055125, filed Sep. 13, 2012.

*Primary Examiner* — Steven J Fulk
*Assistant Examiner* — Eric Ward
(74) *Attorney, Agent, or Firm* — Dinsmore & Stohl

(57) ABSTRACT

Frontside-illuminated barrier infrared photodetector devices and methods of fabrication are disclosed. In one embodiment, a frontside-illuminated barrier infrared photodetector includes a transparent carrier substrate, and a plurality of pixels. Each pixel of the plurality of pixels includes an absorber layer, a barrier layer on the absorber layer, a collector layer on the barrier layer, and a backside electrical contact coupled to the absorber layer. Each pixel has a frontside and a backside. The absorber layer and the barrier layer are non-continuous across the plurality of pixels, and the barrier layer of each pixel is closer to a scene than the absorber layer of each pixel. A plurality of frontside common electrical contacts is coupled to the frontside of the plurality of pixels, wherein the frontside of the plurality of pixels and the plurality of frontside common electrical contacts are bonded to the transparent carrier substrate.

19 Claims, 13 Drawing Sheets

(51) Int. Cl.
  *H01L 31/0352*  (2006.01)
  *H01L 31/0304*  (2006.01)
  *B82Y 20/00*    (2011.01)
  *H01L 31/101*   (2006.01)
  *H01L 31/0232*  (2014.01)

(52) U.S. Cl.
  CPC ..... *H01L31/0232* (2013.01); *H01L 31/035236* (2013.01); *H01L 27/1465* (2013.01); *H01L 27/1469* (2013.01); *H01L 27/14694* (2013.01); *H01L 31/03046* (2013.01); *Y02E 10/544* (2013.01); *B82Y 20/00* (2013.01); *H01L 31/101* (2013.01)

(56) References Cited

U.S. PATENT DOCUMENTS

| | | | |
|---|---|---|---|
| 4,740,819 A | 4/1988 | Ouchi et al. | |
| 4,939,369 A | 7/1990 | Elabd | |
| 4,956,687 A | 9/1990 | de Bruin et al. | |
| 5,227,656 A | 7/1993 | Timlin et al. | |
| 5,300,777 A | 4/1994 | Goodwin | |
| 5,304,500 A | 4/1994 | Timlin et al. | |
| 5,466,331 A | 11/1995 | Belcher | |
| 5,470,761 A | 11/1995 | McKee et al. | |
| 5,679,267 A | 10/1997 | Belcher et al. | |
| 5,847,390 A | 12/1998 | Long et al. | |
| 5,936,268 A | 8/1999 | Cockrum et al. | |
| 6,028,323 A | 2/2000 | Liu | |
| 6,117,702 A | 9/2000 | Nakamura et al. | |
| 6,204,088 B1 | 3/2001 | White et al. | |
| 6,359,283 B1 | 3/2002 | Gordon et al. | |
| 6,410,917 B1 | 6/2002 | Choi | |
| 6,561,693 B1 | 5/2003 | Martin | |
| 6,864,552 B2 | 3/2005 | Razeghi | |
| 7,095,026 B2 | 8/2006 | Devitt et al. | |
| 7,129,104 B2 | 10/2006 | Gunapala et al. | |
| 7,217,982 B2 | 5/2007 | Taylor et al. | |
| 7,291,858 B2 | 11/2007 | Sundaram et al. | |
| 7,307,290 B2 | 12/2007 | Iwasaki et al. | |
| 7,479,401 B2 | 1/2009 | Lai et al. | |
| 7,566,875 B2 | 7/2009 | Starikov et al. | |
| 7,608,830 B1 | 10/2009 | Kinch | |
| 7,652,252 B1 | 1/2010 | Rajavel et al. | |
| 7,687,871 B2 | 3/2010 | Maimon | |
| 7,723,815 B1 | 5/2010 | Peterson et al. | |
| 7,777,186 B2 | 8/2010 | Endres et al. | |
| 7,800,067 B1 | 9/2010 | Rajavel et al. | |
| 7,928,389 B1 | 4/2011 | Yap et al. | |
| 7,936,034 B2 | 5/2011 | Rothman | |
| 7,944,020 B1 | 5/2011 | Korobov et al. | |
| 8,003,434 B2 | 8/2011 | Maimon | |
| 8,044,435 B2 | 10/2011 | Scott et al. | |
| 8,338,200 B2 | 12/2012 | Forrai et al. | |
| 8,492,702 B2 | 7/2013 | Bahir et al. | |
| 8,969,986 B1 * | 3/2015 | Yap et al. | 257/432 |
| 2008/0073743 A1 | 3/2008 | Alizadeh et al. | |
| 2009/0032894 A1 | 2/2009 | Maryfield et al. | |
| 2009/0072144 A1 | 3/2009 | Krishna et al. | |
| 2010/0155602 A1 | 6/2010 | Scherer et al. | |
| 2011/0095334 A1 | 4/2011 | Scott | |
| 2012/0193608 A1 | 8/2012 | Forrai et al. | |

FOREIGN PATENT DOCUMENTS

| | | |
|---|---|---|
| EP | 2246662 A2 | 11/2010 |
| EP | 2302678 A2 | 3/2011 |
| JP | 2009164302 A | 7/2009 |
| WO | 02084740 A2 | 10/2002 |
| WO | 2005004243 A1 | 1/2005 |

* cited by examiner

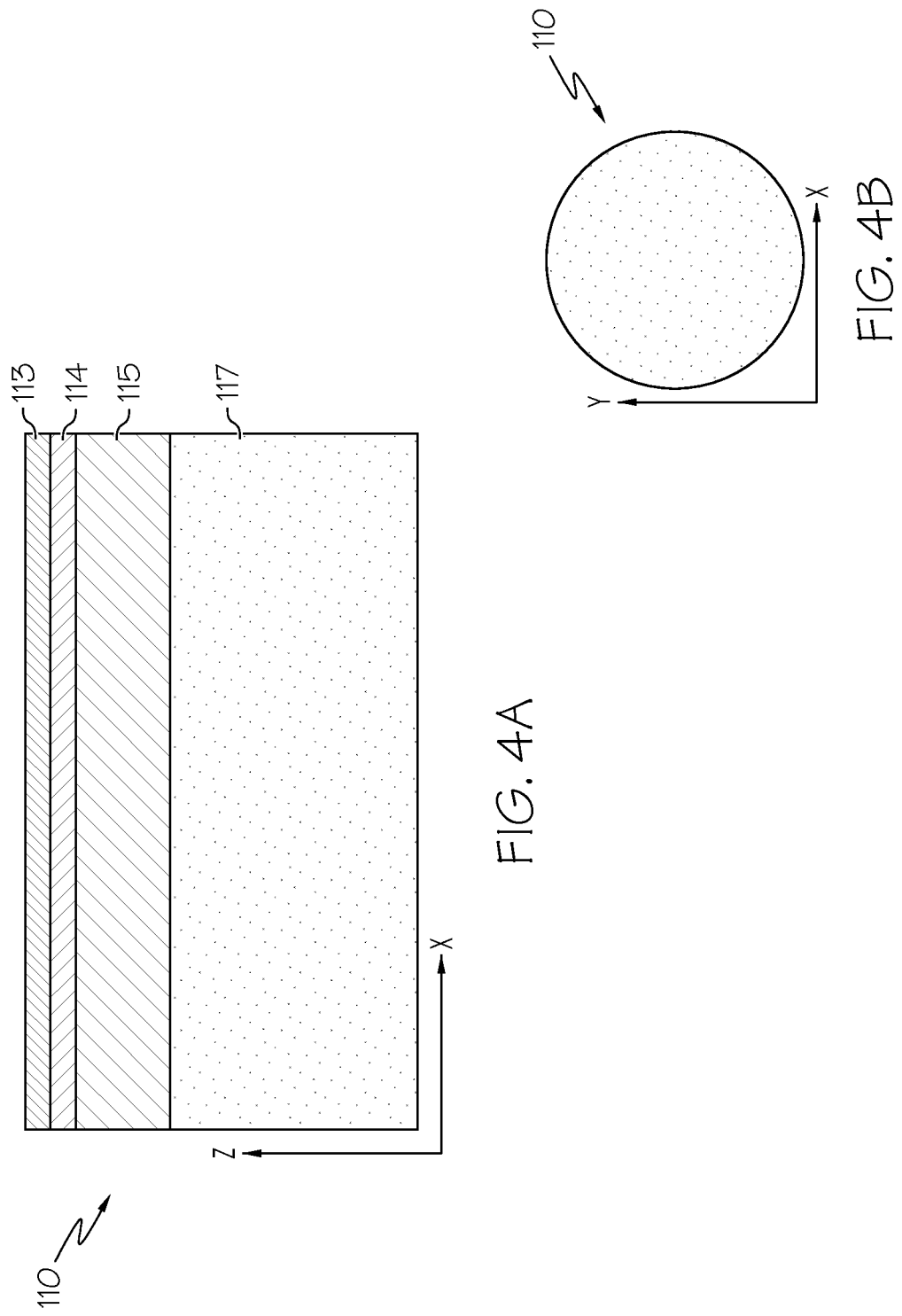

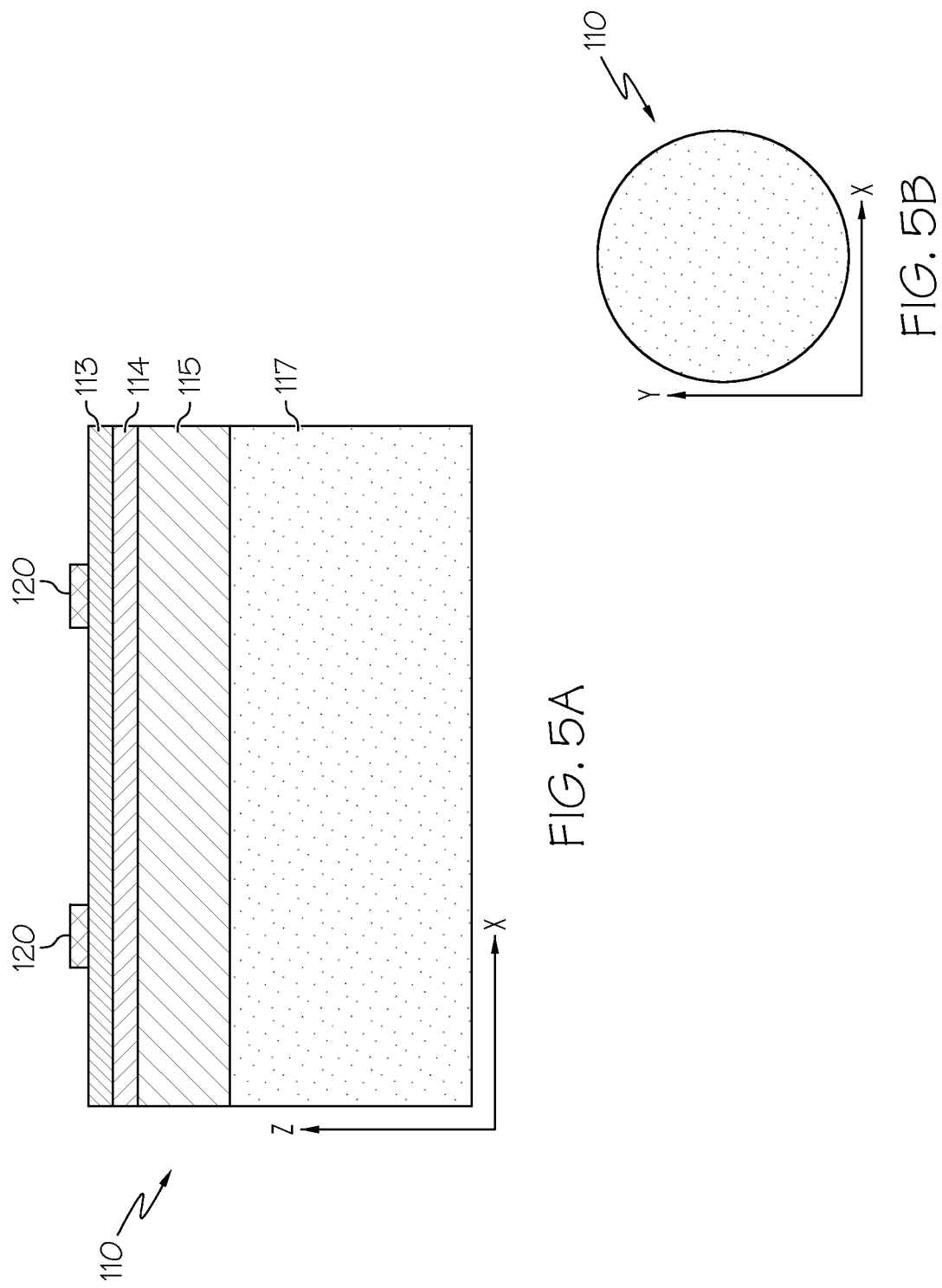

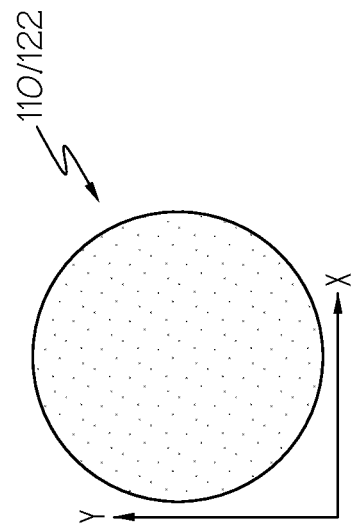
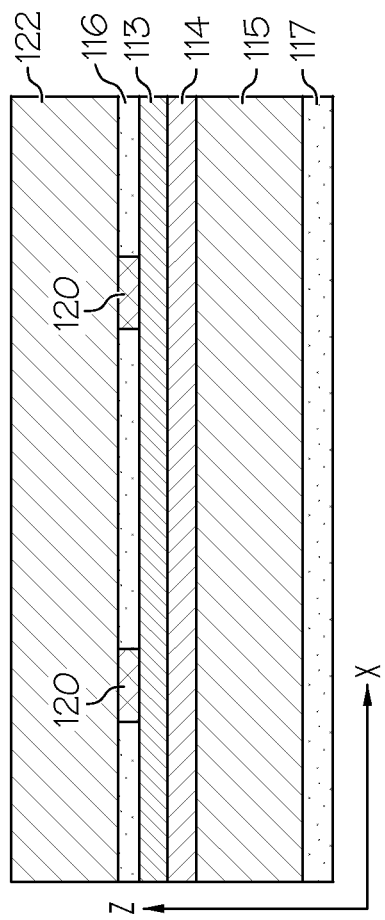

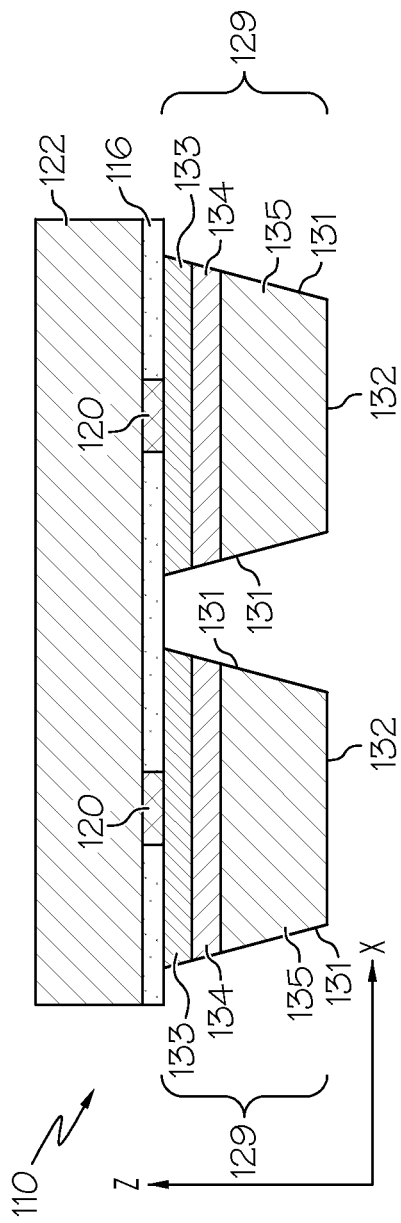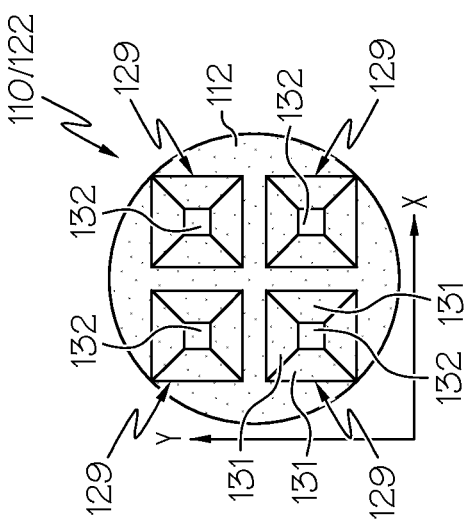

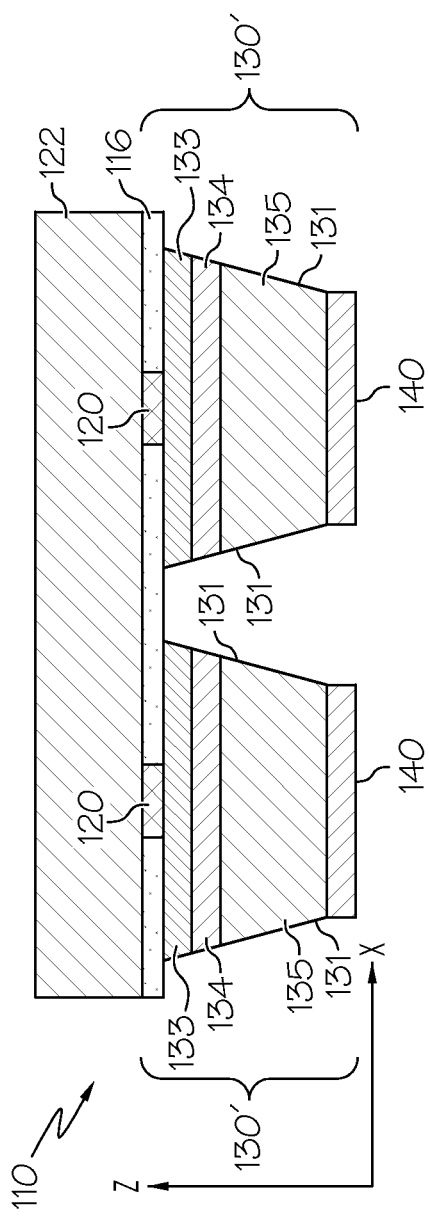
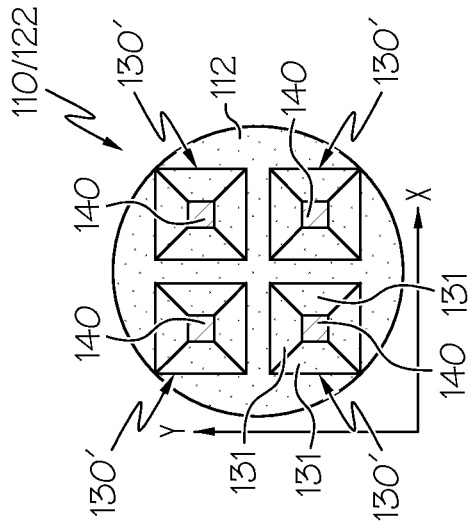
FIG. 9A
FIG. 9B

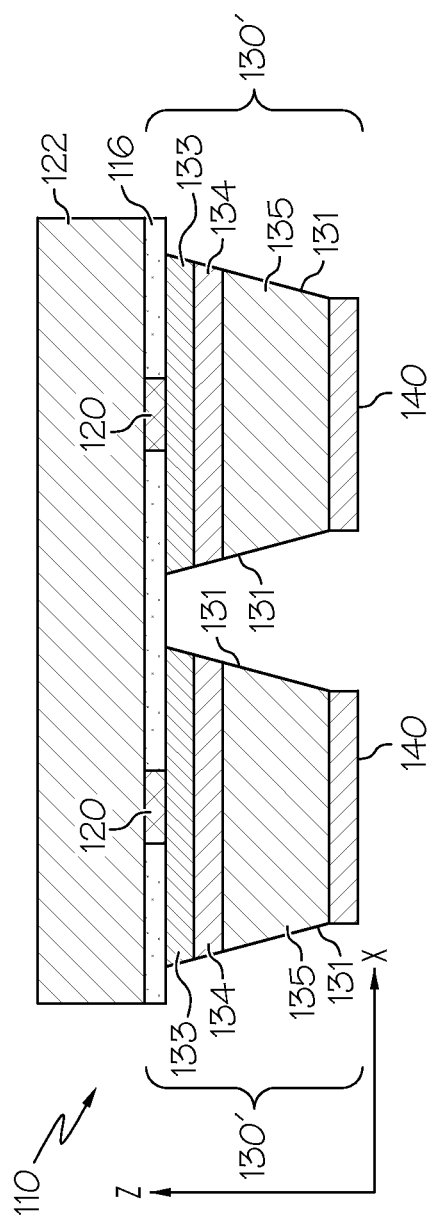
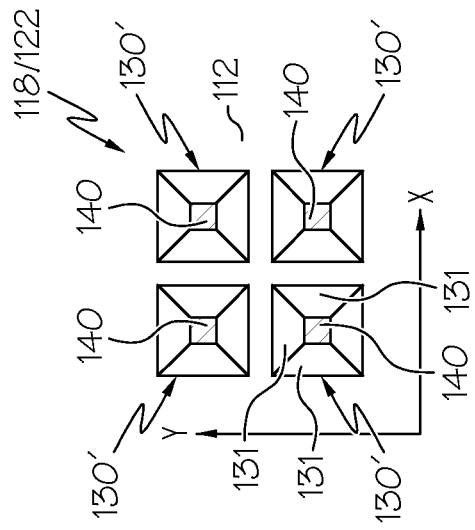
FIG. 10A
FIG. 10B

US 9,076,702 B2

FRONTSIDE-ILLUMINATED BARRIER INFRARED PHOTODETECTOR DEVICE AND METHODS OF FABRICATING THE SAME

CROSS REFERENCE TO RELATED APPLICATIONS

The present application is a divisional of U.S. patent application Ser. No. 13/614,433 entitled "Frontside-Illuminated Barrier Infrared Photodetector Device and Methods of Fabricating the Same," filed on Sep. 13, 2012 which claims the benefit of U.S. patent application Ser. No. 61/534,184 entitled "Enhanced Barrier Structure Devices and Methods of Manufacturing," filed on Sep. 13, 2011, both of which are hereby incorporated by reference in their entirety.

TECHNICAL FIELD

Embodiments relate generally to infrared sensors and, more particularly, to frontside-illuminated barrier infrared photodetector devices capable to detecting radiation in the infrared spectral range, and methods of fabricating the same.

BACKGROUND

An infrared focal plane array (FPA) is an imaging sensing apparatus that includes an array of photodetector pixels capable of detecting photons in the infrared spectrum. The pixels of infrared FPAs may be formed of a material that is sensitive to infrared radiation, such as indium antimonide (InSb), Mercury Cadium Telluride (MCT), gallium arsenide and aluminum gallium arsenide, or other infrared-sensitive detector materials. However, infrared FPAs having pixels fabricated from such materials are required to be cooled to very low temperatures, such as cryogenic temperatures, for example. Therefore, traditional infrared FPAs require the addition of an expensive and bulky cooling system.

SUMMARY

According to one embodiment, a method of fabricating a frontside-illuminated barrier infrared photodetector includes providing a semiconductor wafer having a bulk substrate layer, an absorber layer on the bulk substrate layer, a barrier layer on the absorber layer, and a collector layer on the barrier layer. The bulk substrate layer is on a backside of the semiconductor wafer, the collector layer is on a frontside of the semiconductor wafer, the absorber layer is operable to absorb photon radiation, and the barrier layer is configured such that a flow of a first carrier type is impeded, and a flow of a second carrier type is unimpeded. The method further includes applying a plurality of frontside common electrical contacts to the collector layer thereby forming a common collector circuit, bonding a transparent carrier substrate to the frontside of the semiconductor wafer and the plurality of frontside common electrical contacts, thinning the bulk substrate layer of the semiconductor wafer, and reticulating the absorber layer and the barrier layer to form a plurality of stacks. The transparent carrier substrate is transparent to radiation in a predetermined wavelength range. The absorber layer and the barrier layer are non-continuous across the plurality of stacks. The method further includes applying a backside electrical contact to each stack to form a plurality of pixels, and singulating the semiconductor wafer and the transparent carrier substrate into at least one barrier infrared photodetector array.

According to another embodiment, a frontside-illuminated barrier infrared photodetector includes a transparent carrier substrate and a plurality of pixels. Each pixel of the plurality of pixels includes an absorber layer, a barrier layer on the absorber layer, a collector layer on the barrier layer, and a backside electrical contact coupled to the absorber layer. Each pixel has a frontside and a backside. The absorber layer and the barrier layer are non-continuous across the plurality of pixels, and the barrier layer of each pixel is closer to a scene than the absorber layer of each pixel. A plurality of frontside common electrical contacts is coupled to the frontside of the plurality of pixels, wherein the frontside of the plurality of pixels and the plurality of frontside common electrical contacts are bonded to the transparent carrier substrate.

According to yet another embodiment, a frontside-illuminated barrier infrared photodetector focal plane array includes a transparent carrier substrate, a plurality of pixels, and a read-out integrated circuit assembly. Each pixel includes an absorber layer, a barrier layer on the absorber layer, a collector layer on the barrier layer, a backside electrical contact coupled to the absorber layer, and a frontside common electrical contact coupled to the collector layer. Each pixel has a frontside and a backside. The absorber layer and the barrier layer are non-continuous across the plurality of pixels, and the barrier layer of each pixel is closer to a scene than the absorber layer of each pixel. The frontside common electrical contact of each pixel are electrically coupled to one another, and the frontside of the plurality of pixels and corresponding frontside common electrical contacts are bonded to the transparent carrier substrate. The read-out integrated circuit assembly includes a read-out integrated circuit substrate and a plurality of electrical contacts, wherein the read-out integrated circuit assembly is bonded to the backside electrical contacts of the plurality of pixels by a plurality of indium bonding bumps.

According to yet another embodiment, an infrared sensor device includes a Dewar flask, an infrared transparent window disposed within the Dewar flask to provide an optical path into the Dewar flask for infrared radiation, a cold plate also disposed within the Dewar flask, and a cooler device thermally coupled to the cold plate by a cold finger. The cooler device is operable to cool the cold plate to an operating temperature. The infrared sensor device further includes a frontside-illuminated barrier infrared photodetector focal plane array that includes a transparent carrier substrate, a plurality of pixels, and a read-out integrated circuit assembly. Each pixel includes an absorber layer, a barrier layer on the absorber layer, a collector layer on the barrier layer, a backside electrical contact coupled to the absorber layer, and a frontside common electrical contact coupled to the collector layer. Each pixel has a frontside and a backside. The absorber layer and the barrier layer are non-continuous across the plurality of pixels, and the barrier layer of each pixel is closer to a scene than the absorber layer of each pixel. The frontside common electrical contacts are electrically coupled to one another, and the frontside of the plurality of pixels and corresponding frontside common electrical contacts are bonded to the transparent carrier substrate. The read-out integrated circuit assembly includes a read-out integrated circuit substrate and a plurality of electrical contacts, wherein the read-out integrated circuit assembly is bonded to the backside electrical contacts the plurality of pixels by a plurality of indium bonding bumps. The frontside-illuminated barrier infrared photodetector focal plane array is thermally coupled to the cold plate. The infrared sensor device further includes a cold shield disposed within the Dewar flask and thermally coupled to the cooler device. The cold shield is arranged to permit desired radiation within the angular region of the scene and spectral range to be incident on the frontside-illuminated barrier infrared photodetector focal plane array.

BRIEF DESCRIPTION OF THE DRAWINGS

The following detailed description will be more fully understood in view of the drawings in which:

FIGS. 4A and 4B depicts a schematic illustration of a semiconductor wafer comprising a bulk substrate layer, an absorber layer, a barrier layer, and a collector layer according to one or more embodiments described and illustrated herein;

FIGS. 5A and 5B depict a schematic illustration of frontside common electrical contacts applied to the collector layer illustrated in FIGS. 4A and 4B, according to one or more embodiments described and illustrated herein;

FIGS. 7A and 7B depict a schematic illustration of the semiconductor wafer and transparent substrate illustrated in FIGS. 6A and 6B after a bulk substrate thinning process, according to one or more embodiments described and illustrated herein;

FIGS. 8A and 8B depict a schematic illustration of the semiconductor wafer and the transparent substrate illustrated in FIGS. 7A and 7B after the formation of semiconductor stacks by an etching process, according to one or more embodiments described and illustrated herein;

FIGS. 9A and 9B depict a schematic illustration of the semiconductor wafer and the transparent substrate illustrated in FIGS. 8A and 8B after the application of backside electrical contacts to the semiconductor stacks, according to one or more embodiments described and illustrated herein;

FIGS. 10A and 10B depict a schematic illustration of a frontside-illuminated barrier infrared photodetector singulated from the semiconductor wafer and the transparent substrate illustrated in FIGS. 9A and 9B, according to one or more embodiments described and illustrated herein;

Figure 1:
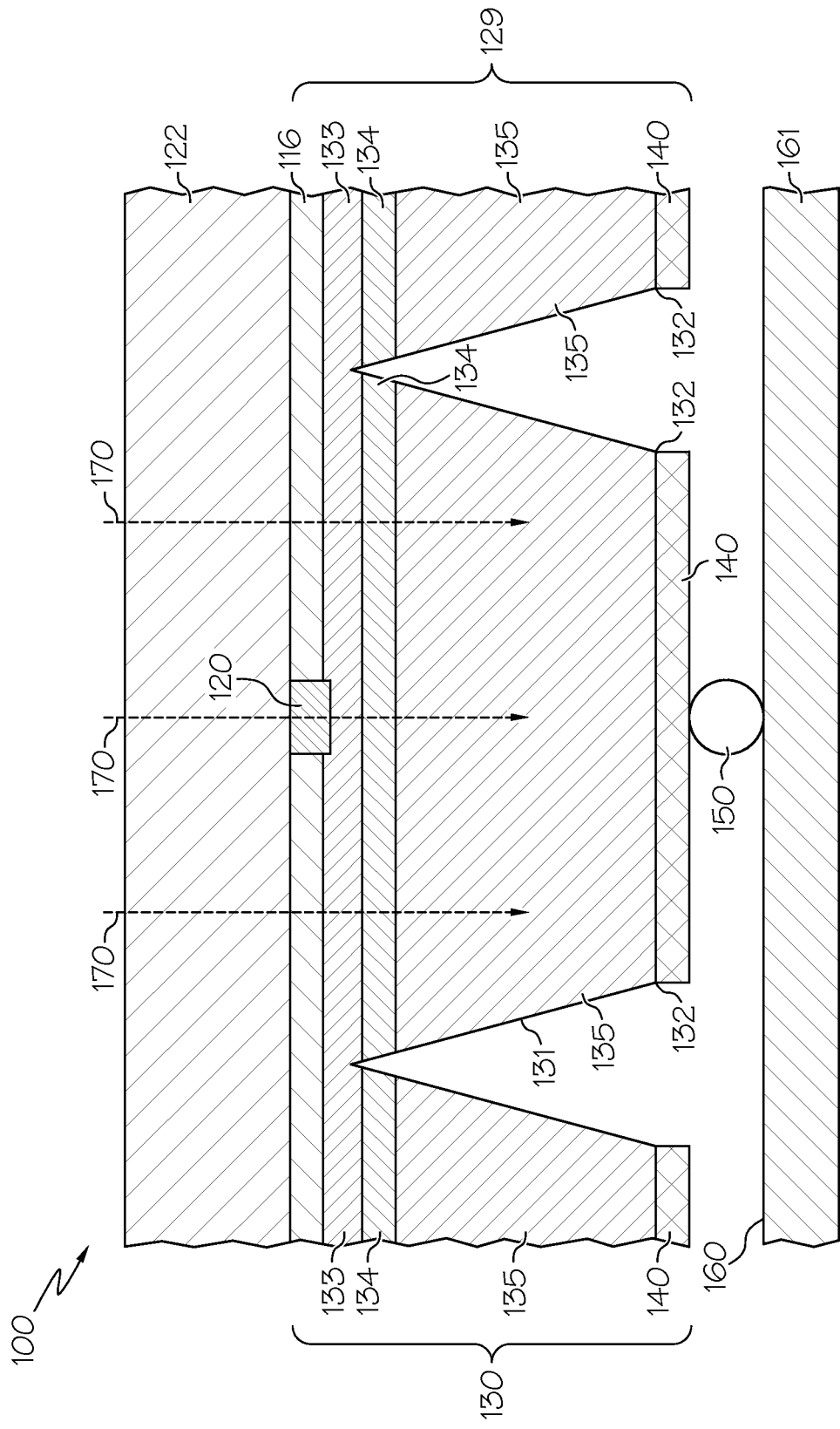
FIG. 1 depicts a schematic illustration of a semiconductor stack within a frontside-illuminated barrier infrared photodetector focal plane array according to one or more embodiments described and illustrated herein.

The embodiments set forth in the drawings are illustrative in nature and are not intended to be limiting of the subject matter defined by the claims. Moreover, individual features of the drawings and the embodiments will be more fully apparent and understood in view of the detailed description.

DETAILED DESCRIPTION OF ILLUSTRATIVE EMBODIMENTS

Referring generally to the drawings, embodiments of frontside-illuminated barrier infrared photodetector (BIRD) devices and fabrication methods thereof are illustrated. Frontside-illuminated barrier infrared photodetector devices are photo-voltaic (or photoconductive, depending on doping levels of various semiconductor layers) that are operable to detect radiation in the infrared and/or near infrared spectrum (e.g., mid-wave infrared (MWIR), short-wave infrared (SWIR), and/or long-wave infrared (LWIR)). The illustrated BIRD devices generally comprise a transparent substrate, a plurality of frontside common electrical contacts, and a stack of semiconductor material that forms a pixel. A plurality of pixels according to the BIRD devices described herein may be coupled to a readout integrated circuit (ROIC) via bonding bumps, thereby providing a frontside-illuminated barrier infrared photodetector focal plane array having of an array of pixels. It is noted that embodiments of the BIRD devices and focal plane arrays described herein are referred to as frontside-illuminated because radiation enters the device at a frontside of the detector array.

As described in more detail below, each stack of semiconductor material that defines a pixel comprises a collector layer, a barrier layer, and an absorber layer. The barrier layer has a wide band gap material that acts as an electron barrier. The material is chosen such that there is a large discontinuity in the conduction band, and little or no discontinuity in the valence band. The materials used to fabricate the various layers may be bulk semiconductor material, binary semiconductor composition, ternary semiconductor composition, quaternary semiconductor composition, or strained layer superlattice composition.

Generally, BIRD devices may be fabricated by thinning a substrate layer positioned on a backside of a semiconductor wafer having the contact, barrier and absorber layers. The remaining semiconductor wafer, which contains the contact, barrier and absorber layers, is etched to form reticulated semiconductor stacks that define pixels. Electrical contacts are provided on both the frontside and backside the semiconductor wafer to provide electrical connection to a ROIC device for signal interpretation. The frontside-illuminated barrier infrared photodetector device may provide for a device with relatively low dark current, increased collection efficiency, and increased thermal reliability of focal plane arrays incorporating such BIRD devices. Various embodiments of frontside-illuminated barrier infrared photodetector focal plane arrays and methods of fabricating frontside-illuminated barrier infrared photodetector devices will be described in more detail herein.

Referring now to FIG. 1, one embodiment of a BIRD device configured as a BIRD focal plane array 100 is illustrated. Generally, the illustrated BIRD focal plane array 100 comprises a transparent substrate 122, frontside common electrical contacts 120, semiconductor stacks 129 (defining pixels 130), bonding bumps 150, and a ROIC assembly 160. It should be understood that the BIRD focal plane array 100 may comprise an array of semiconductor stacks 129 providing an array of photodetector devices, and that only semiconductor stack 129 is fully illustrated in FIG. 1 for ease of illustration. The transparent substrate 122 comprises a material that is transparent to radiation in the desired wavelength, such as wavelengths in the infrared or near-infrared spectrum. The transparent substrate 122, which may be made of silicon, for example, provides a window or an entry point for radiation (illustrated as arrows 170 into the BIRD focal plane array 100). It is noted that an optional anti-reflective layer (not shown) may be applied to the transparent substrate 122 to ensure that infrared radiation entering the BIRD focal plane array 100 is maintained within the semiconductor stack 129.

The plurality of frontside common electrical contacts 120 is positioned between a frontside of the semiconductor stack 129 and the transparent substrate 122. In some embodiments, the frontside common electrical contacts 120 may be configured as a metal grid that is overlaid on the frontside of the semiconductor stack 129. The frontside common electrical contacts 120 are made of an electrically conductive material, such as gold, for example. The area of the plurality of frontside common electrical contacts may be relatively small so as to not block incoming radiation. Although not illustrated in FIG. 1, the frontside common electrical contacts 120 may be positioned on an insulating layer (e.g., an oxide layer such as silicon monoxide or silicon dioxide) that is applied to the frontside of the semiconductor stack material during fabrication. Therefore, the insulating layer may be located between the frontside common electrical contacts 120 and the semiconductor stack 129. The frontside common electrical contacts 120 provide a reference potential (e.g., ground) for the frontside of the semiconductor stack 129 and, in the case of a focal plane array comprising an array of semiconductor stacks 129, a reference potential for all of the semiconductor stacks within the array. The metal grid defining the frontside common electrical contacts 120 may be electrically coupled to a circuit, such as a read-out integrated circuit of the ROIC assembly 160. It should be understood that the frontside common electrical contacts 120 may be configured in an arrangement other than a grid pattern. The semiconductor stack 129 is electrically coupled to a backside electrical contact 140. The frontside common electrical contact 120, the semiconductor stack 129, and the backside electrical contact 140 define a pixel 130.

The semiconductor stack 129 is coupled to the frontside common electrical contacts 120 and the transparent substrate 122. In one embodiment, the semiconductor stack 129 is bonded to the transparent substrate 122 via an adhesive bonding layer 116, such as an epoxy adhesive. The adhesive chosen should be suitable for use from cryogenic temperatures to approximately 300° C., such that it does not outgas, deform, crack or otherwise degrade during fabrication and operation of the BIRD focal plane array 100. The material used for the adhesive bonding layer 116 should be optically transmissive to optical radiation in the predetermined wavelength range.

The illustrated semiconductor stack 129 generally comprises a collector layer 133, a barrier layer 134, and an absorber layer 135. The absorber layer 135 forms a first heterojunction with the collector layer 133, and the barrier layer 134 also forms a second heterojunction with the barrier layer 134. Although not depicted in FIG. 1, a thin substrate layer may also be present on a backside of the absorber layer 135. The thin substrate layer may be a layer that was not fully removed during fabrication, as described below. In the illustrated embodiment, the collector layer 133 is monolithically provided across a plurality of semiconductor stacks 129. In other embodiments, such as the BIRD focal plane array 100' depicted in FIG. 12, the collector layer 133 may be discontinuous across the plurality of semiconductor stacks. The collector layer 133 of each semiconductor stack 129 may be defined by a mesa structure (i.e., a contact mesa) that is aligned with the frontside common electrical contact 120, in some embodiments.

The semiconductor stack 129 has angled walls 131 that provide for a truncated, square pyramidal pixel 130. As shown in FIG. 1, the barrier layer 134 is discontinuous (i.e., non-monolithic) across the plurality of semiconductor stacks 129. Accordingly, the barrier layer 134 of one semiconductor stack 129 does not contact the barrier layer 134 of adjacent semiconductor stacks 129. In this regard, the barrier layer is non-monolithically provided across the plurality of semiconductor stacks 129. Similarly, the absorber layer 135 of each semiconductor stack 129 does not contact the absorber layers 135 of adjacent semiconductor stacks 129.

The absorber layer 135 and the collector layer 133 comprise a narrow band gap material, and the barrier layer 134 may comprise a wide band gap material. The materials chosen for the collector layer 133, barrier layer 134, and absorber layer 135 may be made from bulk semiconductors, binary semiconductor compositions, ternary semiconductor compositions, quaternary semiconductor compositions, and/or strained layer superlattice material compositions. For example, the collector layer 133, barrier layer 134, and absorber layer 135 may be made from III-V semiconductor materials or II-VI semiconductor materials. The absorbing layer of each pixel 130 is capable of detecting radiation in the MWIR, SWIR, or LWIR, depending on the desired predetermined wavelength range.

More specifically, in some embodiments, the material for the collector layer 133 may be p-type, n-type, or unintentionally doped (i.e., substantially no doping) GaSb, $InAs_xSb_{1-x}$/InAs superlattice, $Ga_yIn_{1-y}As_xSb_{1-x}$/$Ga_yIn_{1-y}Sb$ superlattice, $Al_yIn_{1-y}As_xSb_{1-x}$/$Al_yIn_{1-y}As$ superlattice, $Ga_yIn_{1-y}As_xSb_{1-x}$, or combinations thereof. The material for the barrier layer 134 may be p-type, n-type, or unintentionally doped AlAsSb, $(GaSb)_z(LM-AlAsSb)_{1-z}$, or combinations thereof. The material for the absorber layer 135 may be p-type, n-type, or unintentionally doped GaSb, $InAs_xSb_{1-x}$/InAs superlattice, $Ga_yIn_{1-y}As_xSb_{1-x}$/$Ga_yIn_{1-y}Sb$ superlattice, $Al_yIn_{1-y}As_xSb_{1-x}$/$Al_yIn_{1-y}As$ superlattice, $Ga_yIn_{1-y}As_xSb_{1-x}$, or combinations thereof. As an example and not a limitation, the collector layer 133, the barrier layer 134 and the absorber layer 135 are unintentionally doped. In some embodiments, the collector layer 133 comprises unintentionally doped type II $InAs_xSb_{1-x}$/InAs superlattice, the barrier layer 134 comprises unintentionally doped AlAsSb ternary, and the absorber layer 135 comprises unintentionally doped type II $InAs_xSb_{1-x}$/InAs superlattice. As nonlimiting examples, the thickness of the collector layer 133 may be between about 50 Å and about 5000 Å, the thickness of the barrier layer 134 may be between about 500 Å and 7,500 Å, and the thickness of the absorber layer may be between about 5,000 Å and about 180,000 Å.

In some embodiments, each of the absorber layer 135, the barrier layer 134, and/or the collector layer 133 have a doping level such that the device exhibits photo-diode behavior similar to a p-n, p-i-n, n-p, or n-i-p junction device. In other embodiments, each of the absorber layer 135, the barrier layer 134, and/or the collector layer 133 have a doping level such that the device exhibits photo-conductive characteristics, such as photo-conductive lead salts, for example.

As stated above, a backside electrical contact 140 is connected to a peak, backside surface 132 of the semiconductor stack 129. Although not illustrated, an insulator layer may be located on the walls 131 as well as adjacent to the backside electrical contact 140 on the peak backside surface 132. In some embodiments, the backside electrical contact 140 covers substantially all of the backside surface 132 of the semiconductor stack 129 such that it also acts as a mirror to reflect photons not previously absorbed by the semiconductor stack 129 back into the absorber layer 135. The backside electrical contact 140 may be made of an electrically conductive metal (e.g., gold), and provide an electrical connection of the semiconductor stack 129 to the ROIC assembly 160. The frontside common electrical contacts 120 and the backside electrical contacts 140 form Ohmic or pseudo Ohmic electrical connections.

As described in more detail below, the semiconductor stack 129 and associated backside electrical contact 140 may be connected to an electrical contact 162 of the ROIC assembly 160 via an indium bonding bump 150. In a focal plane array, the backside electrical contact 140 of each individual semiconductor stack 129 is connected to the ROIC assembly 160, such that the plurality of frontside common electrical contacts 120, semiconductor stacks 129, and backside electrical contacts 140 define a plurality of individual pixels 130 that may be read by the ROIC assembly 160.

The ROIC assembly 160 may comprise a ROIC substrate 161 having a ROIC located thereon. The ROIC may be configured to receive the photon-excited currents from the semiconductor pixels and either perform signal processing to produce an infrared image or pass the photon-excited currents as signals and/or data to an additional circuit(s) or external device for signal processing. The ROIC substrate 161 has a coefficient of thermal expansion that is substantially equal to the coefficient of thermal expansion of the transparent carrier substrate 122.

Figure 2:
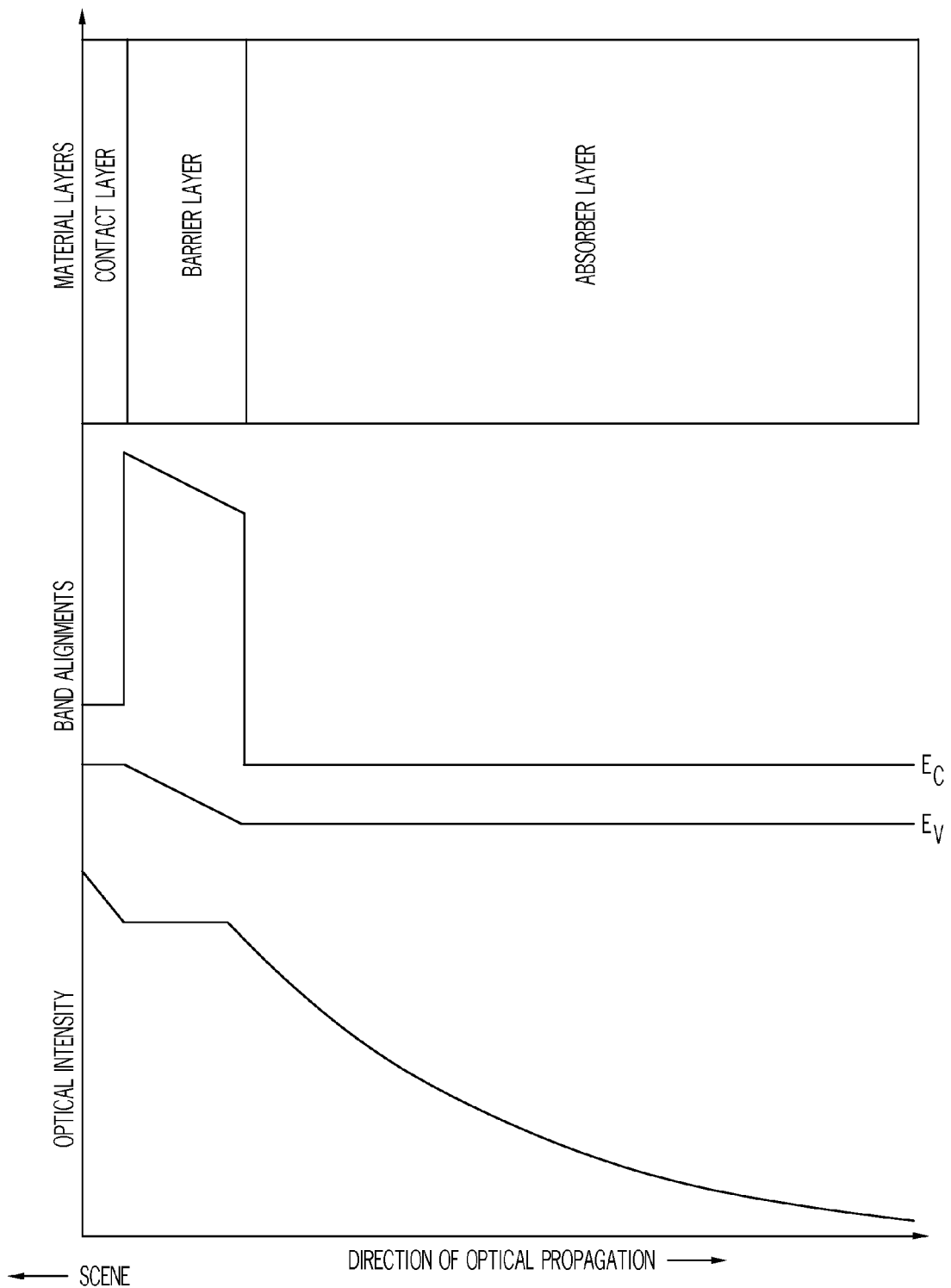
FIG. 2 depicts a graphical illustration of material layers of a frontside-illuminated barrier infrared photodetector, the band alignments of the material layers, and the optical intensity of the material layers, as a function of the direction of optical propagation, according to one or more embodiments described and illustrated herein.

Referring now to FIG. 2, the material layers, associated band alignments under external electrical bias, and associated optical intensity within the stack is plotted with respect to the direction of optical propagation of optical radiation 170. Note that the concentration of photo carrier density is directly proportional to the optical intensity within the stack.

As shown in FIG. 2, the collector layer 133 faces the scene, and is the layer that is closest to the scene and the source of radiation. The collector layer 133 may have a band gap within the predetermined wavelength range, and should be as thin as possible to minimize optical absorption, as shown in the bottom, optical intensity graph of FIG. 2.

The barrier layer 134 comprises a wide band gap material that acts as an electron barrier, as indicted by the middle band alignment graph of FIG. 2. The material may be chosen such that there is a large discontinuity in the conduction band $E_c$, and no discontinuity in the valence band $E_v$. It should be understood that in embodiments that are configured as photoconductive with electrons as the photo-carrier, the barrier layer 134 should provide a large discontinuity in the valence band $E_v$, and no discontinuity in the conduction band $E_c$. The material of the barrier layer 134 should have a band gap wide enough to have insubstantial absorption in the spectral band of interest, as shown in the optical intensity graph of FIG. 2.

The absorber layer 135 should be thick enough to absorb substantially all incident photons. As shown in the band alignment graph FIG. 2, the highest optical intensity in the absorber layer 135 occurs at the absorber layer 135—barrier layer 134 interface. Because the photo carrier (e.g., hole) concentration is proportional to the optical intensity, a large number of photo-generated holes exist near the barrier layer 134. Embodiments of the present disclosure collect holes by sweeping them across the barrier layer 134 when the device is electrically biased. Therefore, the majority of holes do not drift far to be collected, thus the BIRD devices described herein offer a high collection efficiency.

Figure 3:
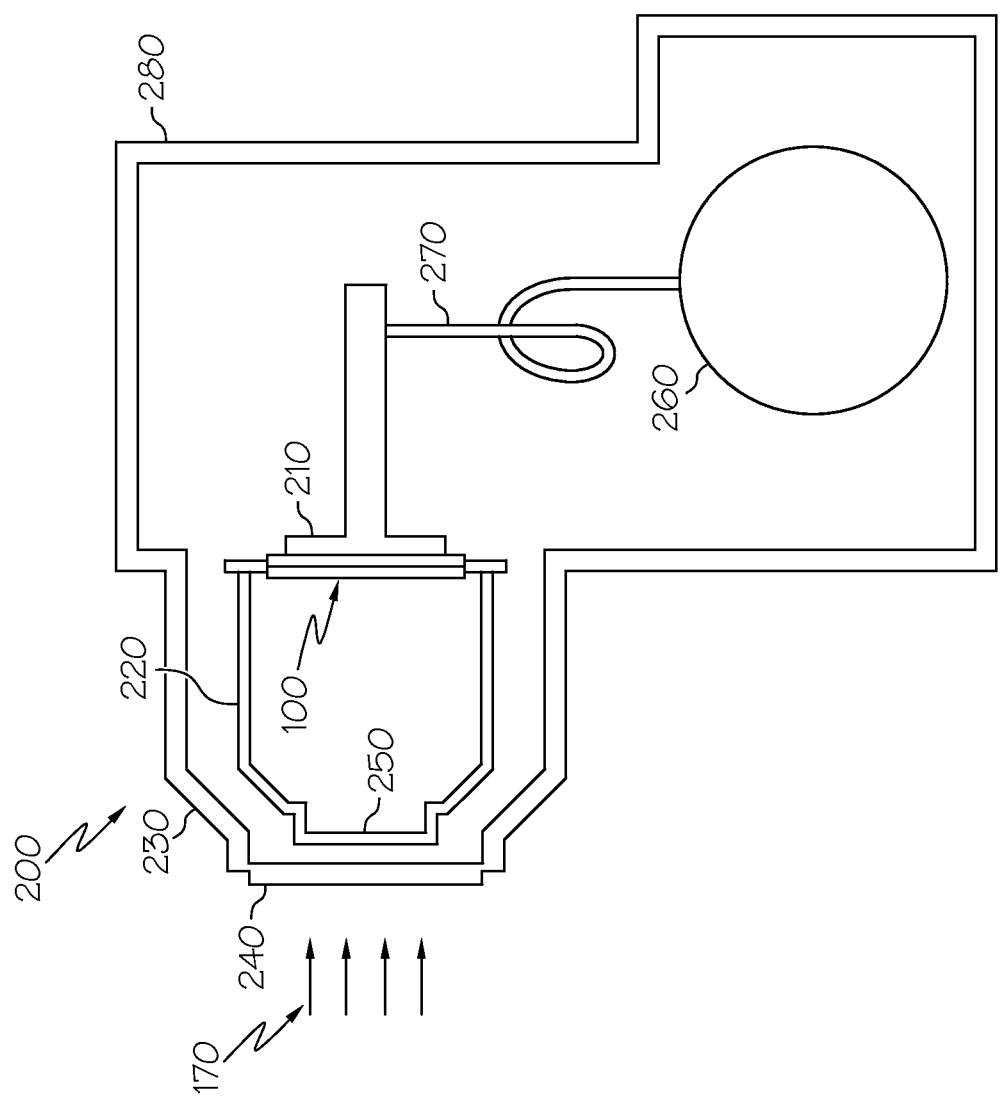
FIG. 3 depicts a schematic illustration of an infrared sensor device including a frontside-illuminated barrier infrared photodetector focal plane array, according to one or more embodiments described and illustrated herein.

Referring now to FIG. 3, the BIRD focal plane array 100 may be provided as a component of an infrared sensor device 200 used in infrared sensing applications. FIG. 3 schematically depicts an infrared sensor device 200 according to some embodiments. The infrared sensor device 200 may generally comprise a BIRD focal plane array 100, a cooler device 260 disposed within a housing 280, a Dewar flask 230 and a cold shield 220. The BIRD focal plane array 100 and the cold shield 220 are disposed in the Dewar flask 230, which provides a vacuum and may be coupled to one or more housing components (e.g., housing 280). An infrared transparent window 240 is provided in the Dewar flask 230 to allow radiation 170 to enter the infrared sensor device 200. The BIRD focal plane array 100 is thermally coupled to a cold plate 210, which is in turn thermally coupled to a cold finger 270 of the cooler device 260. The cooler device 260 is configured to maintain the BIRD focal plane array 100 within an operating temperature range (e.g., about 50K to about 200K). Nonlimiting examples of the cooler device 260 include a split sterling cycle linear cooler and a Rotary sterling cycle cooler. The cold plate 210 may be fabricated from a thermally conductive material, such as copper or aluminum, for example. It should be understood that other materials may be used.

The cold shield 220 is also thermally coupled to the cold finger 270 and the cooler device 260 (e.g., via thermal coupling to the cold plate 210). The cold shield 220 is configured to only let radiation 170 from the scene strike the photo sensitive area of the BIRD focal plane array 100. The cold shield 220 may also include a cold filter 250 to control the spectral response of the infrared sensor device 200. The cold filter 250 may limit radiation from the scene that strikes the photosensitive area of the BIRD focal plane array 100 to substantially transmissive portions of the atmosphere, (e.g. 2.0-2.5 µm, 3.0-5.0 µm, and 8.0-12.0 µm).

The infrared sensor device 200 may be implemented into an infrared camera system to detect infrared radiation within a predetermined wavelength range. For example, the infrared sensor device 200 may be communicably and electrically coupled to a display device (either locally or remotely) to display the scene as detected by the BIRD focal plane array 100. One or more controllers may also be communicably and electrically coupled to the infrared sensor device 200 to provide control signals to one or more components. For example, a control circuit may be provided to read the temperature of the BIRD focal plane array 100 and provide the cooler device 260 with a proportional power drive to maintain the operating temperature of the BIRD focal plane array 100 within a predetermined maximum temperature range. A controllable lens may also be provided and controlled to focus the infrared sensor device 200 accordingly.

Methods of fabricating embodiments of the BIRD focal plane array 100 described above will now be described in detail. Referring to FIGS. 4A and 4B, a semiconductor wafer 110 having a bulk substrate layer 117 (e.g., a GaAs layer), an absorber layer 115 on the bulk substrate layer 117, a barrier layer 114 on the absorber layer 115, and a collector layer 113 on the absorber layer 115. The absorber layer 115, the barrier layer 114, and the collector layer may be epitaxially grown on the bulk substrate layer 117 during fabrication of the semiconductor wafer 110. It should be understood that one or more thin buffer layers used during the fabrication process may be present between the bulk substrate layer 117, the absorber layer 115, the barrier layer 114 and/or the collector layer 113. Further, the interfaces between the various layers of the semiconductor wafer 110 may be graded from one layer to the next. The various layers may be fabricated on the bulk substrate layer 117 by molecular beam epitaxy or metal organic vapor deposition, for example.

Referring now to FIGS. 5A and 5B, frontside common electrical contacts 120 are applied to a frontside of the semiconductor wafer 110. The bulk substrate layer 117 is the backside of the semiconductor wafer 110. The frontside of the semiconductor wafer 110 is the side having the collector layer 113. Accordingly, the collector layer 113 will be closest to the scene when the device is fabricated. The frontside common electrical contacts 120 may be configured as a metal grid made of a conductive material, such as gold, for example, and may be applied using a liftoff process and an ohmic anneal.

Depending on the configuration of the semiconductor wafer 110, the frontside common electrical contacts 120 provide an electrical contact with the collector layer 113. As described in more detail below and illustrated in FIG. 12, a dielectric material layer 125 may also be provided between the frontside common electrical contacts 120 and the collector layer 113. As the frontside common electrical contacts 120 are all electrically connected in a grid formation, they provide a reference potential for the BIRD device, such as ground.

Figure 6A:
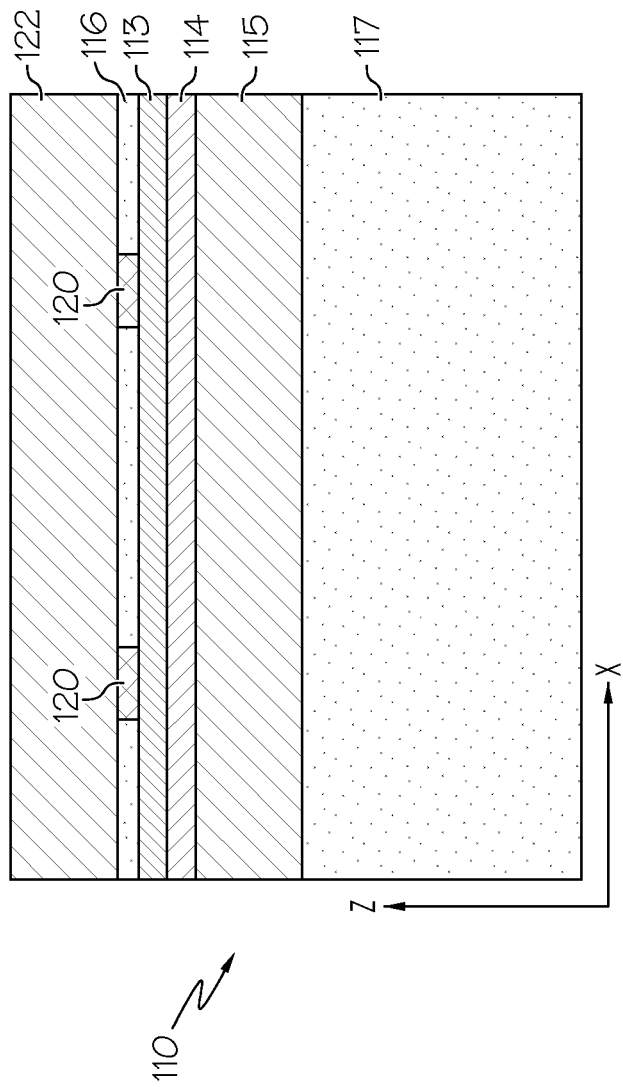
FIGS. 6A and 6B depict a schematic illustration of a transparent substrate bonded to the semiconductor wafer and frontside common electrical contacts illustrated in FIGS. 4A-5B according to one or more embodiments described and illustrated herein.
Figure 6B:
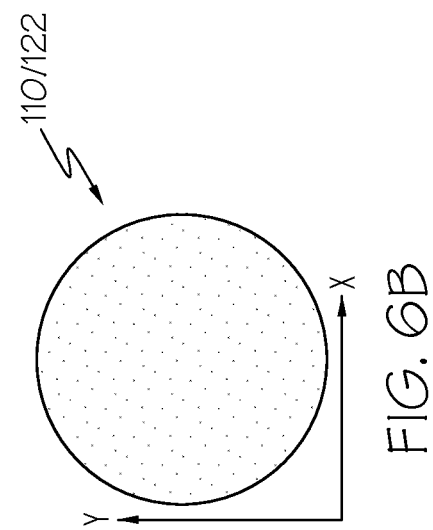

Referring now to FIGS. 6A and 6B, a transparent substrate 122 is bonded to the frontside of the semiconductor wafer 110 using an adhesive bonding layer 116. The transparent substrate 122 is made of a material that is substantially transparent to radiation in the infrared spectral range, such as float zone silicon, for example. In one embodiment, an anti-reflective layer (not shown) may be applied to the transparent substrate 122. Prior to mounting the transparent substrate 122 to the semiconductor wafer 110, the semiconductor wafer 110 and/or the transparent substrate 122 may be cleaned using a de-ionized water rinse or an $O_2$ plasma cleaning process. The transparent substrate 122 may be bonded to the frontside of the semiconductor wafer 110 (and frontside common electrical contacts 120) using an adhesive bonding layer 116. The adhesive material may be an epoxy that does not absorb radiation in the predetermined wavelength range (e.g., infrared or near-infrared).

FIGS. 7A and 7B illustrate a semiconductor wafer 110 and transparent substrate 122 assembly after a thinning of the bulk substrate layer 117. FIG. 7A illustrates an embodiment in which a portion of the bulk substrate layer 117 remains after the thinning process. In this embodiment, a portion of the bulk substrate layer 117 (e.g., GaAs) will be present in the etched semiconductor stacks 129. Enough of the bulk substrate layer 117 should be removed to more easily etch the substrate, but not so much that causes damage to the device. In another embodiment, a majority of the bulk substrate layer 117 is removed such that the later-formed semiconductor stacks 129 consist primarily of the absorber layer 135, the barrier layer 134, and the collector layer 133.

In some embodiments, the bulk substrate layer 117 of the semiconductor wafer 110 may be first thinned mechanically, such as by the application of a milling or grinding device, for example. The bulk substrate layer 117 may be further thinned by a chemical process using a wet etchant solution, such as a solution of $H_3PO_4$—$H_2O_2$—$H_2O$ or a solution of $H_2SO_4$—$H_2O_2$—$H_2O$, until a desired thickness is achieved. Other known and yet-to-be-developed thinning processes may also be utilized.

Referring now to FIGS. 8A and 8B, the remaining absorber layer 115, the barrier layer 114, and the collector layer 113 (as well as a remaining portion of the bulk substrate layer 117, if present) are reticulated to form a plurality of semiconductor stacks 129, each having four facets or walls 131. However, in other embodiments, the stacks 129 are not shaped like a truncated, square pyramid. In one embodiment, a patterned etch mask (not shown) is applied to a backside of the thinned semiconductor wafer 110. The patterned etch mask may comprise a photoresist material, a dielectric material, a metal material, and/or any material capable of resisting the etching material during the etching process. Portions of the absorber layer 115, the barrier layer 114, the collector layer 113, and/or the bulk substrate layer 117 may be removed during a dry etching process, such as a plasma-etch process. The dry etch process reticulates the backside of the semiconductor wafer 110 to form the plurality of individual semiconductor stacks 129, each having the desired facet geometry described above.

At least a portion of the semiconductor stacks 129 may be fully electrically isolated from one another by reticulation. In the illustrated embodiment, the reticulated absorber layer 135, the reticulated barrier layer 134, and the reticulated collector layer 133 of each semiconductor stack 129 are isolated from adjacent semiconductor stacks 129. Accordingly, the absorber layer 135, the barrier layer 134, and the collector layer 133 are non-monolithic across the focal plane array. As depicted in FIG. 1, in some embodiments, the collector layer 133 of adjacent semiconductor stacks 129 may be electrically coupled to one another when the collector layer 133 is not fully reticulated.

In one embodiment, the dry etch process may be followed by a wet etch process in which an etching solution is applied to the backside of the semiconductor wafer 110 to finely remove additional material to achieve semiconductor stacks 129 that meet particular fabrication requirements. Exemplary etchant solutions may include, but are not limited to, a solution of $H_3PO_4$—$H_2O_2$—$H_2O$ or a solution of $H_2SO_4$—$H_2O_2$—$H_2O$. Ion beam milling may also be utilized to fabricate the semiconductor stacks 129.

The number of semiconductor stacks 129 formed may depend on the particular application in which the completed device will operate. As an example and not a limitation, a 1024×1024 pixel BIRD focal plane array may fabricated using the processes described herein. It should be understood that larger and smaller focal plane arrays may be fabricated.

The semiconductor wafer 110 may be cleaned after the etching process using an acetone wash and/or an $O_2$ plasma de-scum process. The patterned etch mask may be removed from the backside of the semiconductor wafer 110.

Referring now to FIGS. 9A and 9B, a backside electrical contact 140 is applied to each semiconductor stack 129. The backside electrical contacts 140 may be made of an electrically conductive material, and may be applied via a liftoff process or any other known or yet-to-be-developed process for depositing metal material onto a substrate. The frontside common electrical contact 120, semiconductor stack 129, and backside electrical contact 140 define an individual pixel 130' of the BIRD device. As described below, the backside electrical contacts 140 electrically couple each individual pixel 130' to the ROIC assembly 160. The backside electrical contact 140 may cover substantially the entire backside surface 132 of the semiconductor stack 129 in some embodiments. In other embodiments, the backside electrical contact 140 may cover only a portion of the backside surface 132. In still other embodiments, the backside electrical contact 140, or another coating or layer, may be provided on the walls 131 to further prevent crosstalk between adjacent pixels 130'.

After applying the backside electrical contacts 140, the semiconductor wafer 110 and transparent substrate 122 may be singulated into one of more semiconductor infrared photodetector arrays 118 (i.e., BIRD devices). As illustrated in FIGS. 10A and 10B, excess semiconductor wafer 110 and transparent substrate 122 may be trimmed to form the semiconductor infrared photodetector array 118. One or more BIRD devices may be singulated from the semiconductor wafer 110 and transparent substrate 122 assembly. The semiconductor wafer 110 and transparent substrate 122 assembly may be singulated by the application of a dicing or sawing mechanism.

Figure 11:
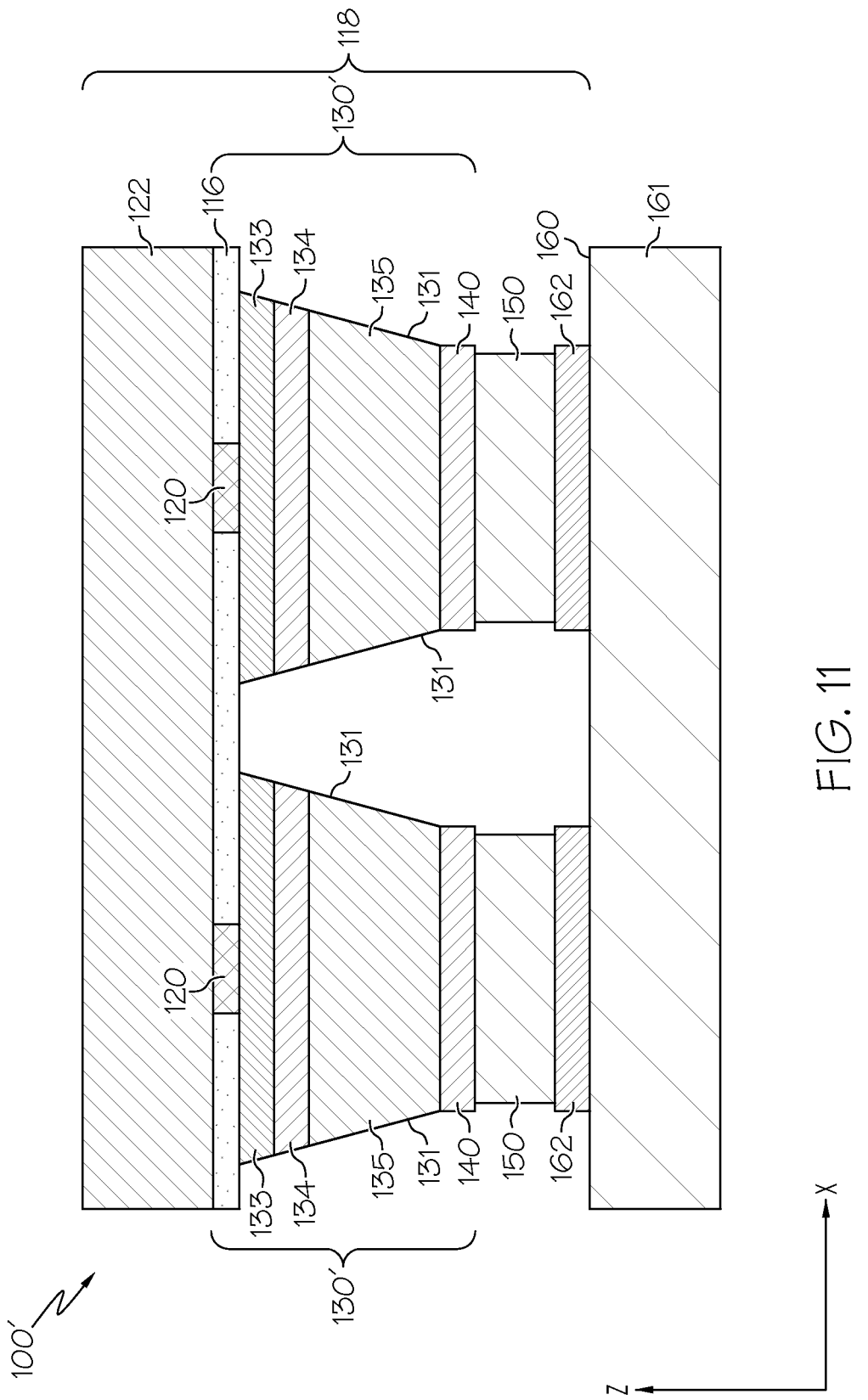
FIG. 11 depicts a schematic illustration of the frontside-illuminated barrier infrared photodetector illustrated in FIGS. 10A and 10B bonded to a read-out integrated circuit assembly, according to one or more embodiments described and illustrated herein.

Referring to FIG. 11, the semiconductor infrared photodetector array 118 may be hybridized to a ROIC assembly 160 to complete the fabrication of a BIRD focal plane array 100'. The semiconductor infrared photodetector array 118 may be bump-bonded to the ROIC assembly 160 using bonding bumps 150, which may be made of indium, for example. The ROIC assembly 160 has a plurality of electrical contacts 162 that are arranged to align with the backside electrical contacts 140 of the semiconductor infrared photodetector array 118. A bonding bump 150 may be applied to the backside electrical contacts 140 and/or the electrical contacts 162 via a liftoff process or other known or yet-to-be-developed process. The semiconductor infrared photodetector array 118 may then be positioned on the ROIC assembly 160 such that the backside electrical contacts 140 are aligned with the electrical contacts 162, and then heated to bond the two components together. The completed BIRD focal plane array 100 may then be washed and inspected.

In one embodiment, additional filter layers may be applied to the transparent substrate 122 to condition the incoming infrared radiation. For example, a polarizer layer and/or a spectral filter layer may be applied to the transparent substrate 122.

Figure 12:
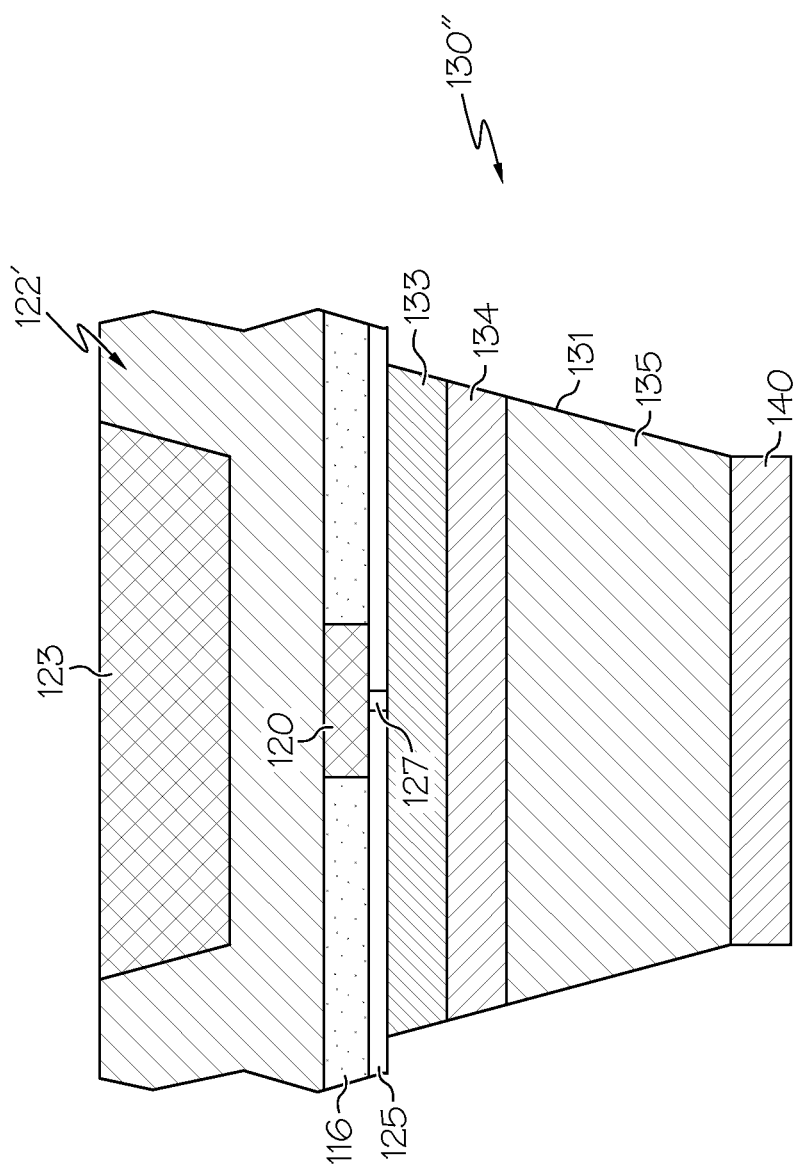
FIG. 12 depicts a schematic illustration of a pixel comprising a dielectric material layer between a frontside common electrical contact and a collector layer, according to one or more embodiments described and illustrated herein.

Referring now to FIG. 12, an alternative pixel 130" according to some embodiments is schematically depicted. A thin dielectric material layer 125 comprising SiO, $SiO_x$, silicon nitride, or a combination thereof, is disposed between the frontside common electrical contact 120 and the collector layer 133. The dielectric material layer 125 may have a thickness between about 4000 Å and about 14,000 Å, for example. Other thicknesses may be used. Electrical connection between the frontside common electrical contact 120 may be provided by a via 127 through the dielectric material layer 125 that is filled with an electrically conductive material. The dielectric material layer 125 may further reduce optical crosstalk between adjacent pixels 130".

Also shown in FIG. 12 is an alternative transparent substrate 122' having an optical component 123 that is configured to act as a lens to aid in directing photons into the pixels 130". It should be understood that such optical components 123 may be provided in embodiments that do not have the thin dielectric material layer 125. More than one optical component 123 may be provided per pixel 130". The optical component 123 may be fabricated from materials such as silicon, germanium, or quartz, depending on the desired radiation incident upon the BIRD focal plane array 100.

Figure 13:
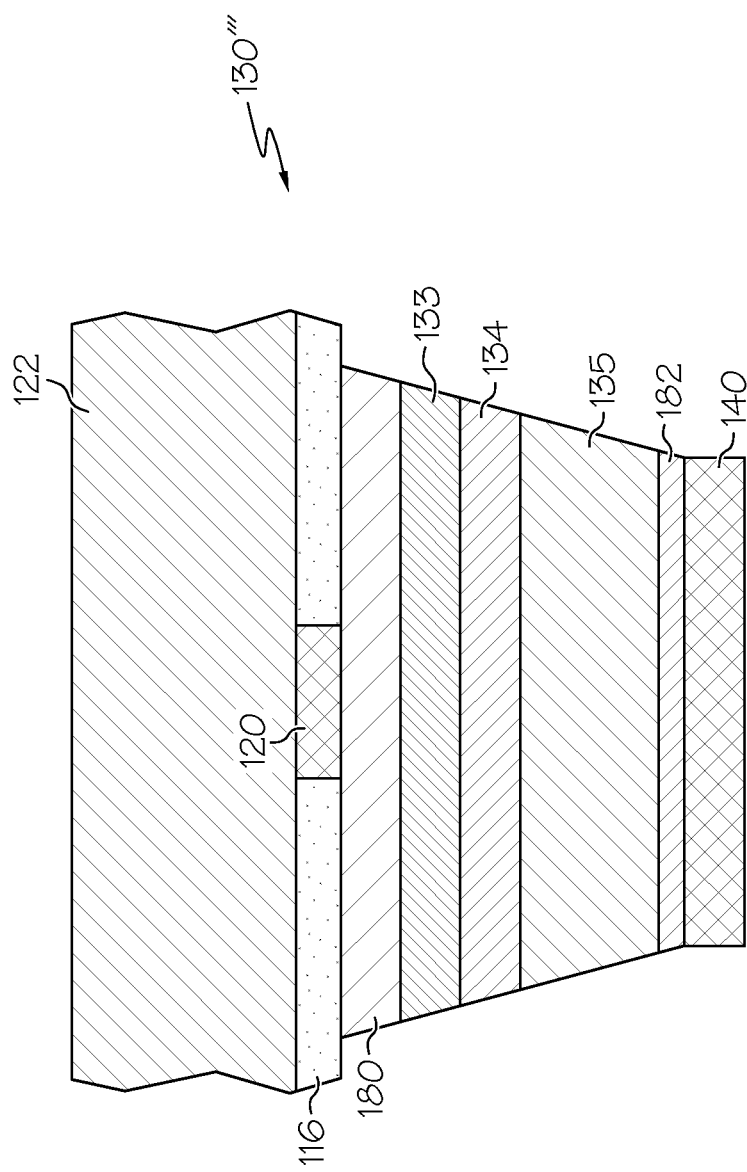
FIG. 13 depicts a schematic illustration of a pixel comprising a doped layer between the collector layer and the frontside common electrical contact and a doped layer between a absorber layer and a backside electrical contact, according to one or more embodiments described and illustrated herein.

In addition to the collector, barrier and absorber layers 133, 134, 135 described above, in some embodiments, additional doped layers may be provided to reduce electrical contact resistance. Referring now to FIG. 13, a pixel 130''' that includes a doped layer 180 between the collector layer 133 and the frontside common electrical contact 120, and a doped layer 182 between the absorber layer 135 and the backside electrical contact 140. These doped layers 180, 182 may fabricated from any of the semiconductor materials described above with appropriate doping levels. The doping levels of these doped layers 180, 182 may be uniformly doped, or gradually doped through the thickness of the layers 180, 182. As non-limiting examples, the doping level range of these doped layers 180, 182 may be about 1E15 $cm^3$ to about 1E19 $cm^3$.

It should now be understood that in the embodiments described above, the collector layers and the barrier layers of the semiconductor stacks are located closer to the incoming infrared radiation than in conventional semiconductor infrared detector devices, thereby increasing the collection efficiency of the device. Because the individual pixels may be fully reticulated and isolated, electrical cross talk between the pixels is limited and the modulation transfer function (MTF) is high. The MTF of the device is defined by the collection area of the device. In the fully reticulated structure as described herein, the collection area is defined by the physical size of the detector, which is less than or equal to the pixel pitch. Thus, the MTF is greater than or equal to the pixel pitch. In conventional semiconductor infrared devices, the pixels are only partly reticulated (or not at all). Thus, photocarriers can drift and be collected by adjacent pixels (i.e., electrical crosstalk). This leads to a collection area greater than or equal to the pixel pitch, which leads to a MTF less than or equal to the pitch. Higher MTF translates to higher image quality. The fully reticulated structures described herein provide the ability to tailor the physical size and shape of the pixel, thus allowing tailoring of the MTF. This allows for optimizing detector MTF in the optical system to support advanced image processing techniques, such as, but not limited to, super-resolution.

For the purposes of describing and defining the embodiments of the present disclosure, it is noted that the terms "approximately" and "substantially" are utilized herein to represent the inherent degree of uncertainty that may be attributed to any quantitative comparison, value, measurement, or other representation. The terms "approximately" and "substantially" are also utilized herein to represent the degree by which a quantitative representation may vary from a stated reference without resulting in a change in the basic function of the subject matter at issue.

The foregoing description of the various embodiments of the present disclosure has been presented for the purposes of illustration and description. It is not intended to be exhaustive or to limit the subject matter of the disclosure to the precise steps and/or forms disclosed. Many alternatives, modifications, and variations will be apparent to those skilled in the art of the above teaching. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall with the principles, spirit and broad scope of the s defined by the claims.

What is claimed is:

1. A frontside-illuminated barrier infrared photodetector comprising:
   a transparent carrier substrate;
   a plurality of pixels, each pixel of the plurality of pixels comprising an absorber layer, a barrier layer on the absorber layer, a collector layer on the barrier layer, a backside electrical contact coupled to the absorber layer, and a frontside common electrical contact coupled to the collector layer, wherein:
   each pixel has a frontside and a backside; and
   the absorber layer and the barrier layer are non-continuous across the plurality of pixels; and
   the barrier layer of each pixel is closer to a scene than the absorber layer of each pixel;
   the frontside common electrical contact of each pixel are electrically coupled to one another; and the frontside of the plurality of pixels and corresponding frontside common electrical contacts are bonded to the transparent carrier substrate.

2. The frontside-illuminated barrier infrared photodetector of claim 1, wherein the backside of each pixel comprises a substantially removed substrate layer.

3. The frontside-illuminated barrier infrared photodetector of claim 1, wherein a frontside of the plurality of pixels is bonded to the transparent carrier substrate with an adhesive bonding layer.

4. The frontside-illuminated barrier infrared photodetector of claim 1, wherein the absorber layer and the collector layer comprise a narrow band gap material, and the barrier layer comprises a wide band gap material.

5. The frontside-illuminated barrier infrared photodetector of claim 1, wherein one or more of the absorber layer, the barrier layer, and the collector layer comprises III-V semiconductor materials or II-VI semiconductor materials.

6. The frontside-illuminated barrier infrared photodetector of claim 1, wherein one or more of the absorber layer, the barrier layer, and the collector layer comprises a bulk semiconductor material, a binary semiconductor composition, a ternary semiconductor composition, a quaternary semiconductor composition, a strained layer superlattice composition, or combinations thereof.

7. The frontside-illuminated barrier infrared photodetector of claim 1, wherein the absorber layer, the barrier layer, and the collector layer are unintentionally doped.

8. The frontside-illuminated barrier infrared photodetector of claim 1, wherein the collector layer comprises GaSb, $InAs_xSb_{1-x}$/InAs superlattice, $Ga_yIn_{1-y}As_xSb_{1-x}$/$Ga_yIn_{1-y}$ superlattice, $Ga_yIn_{1-y}As_xSb_{1-x}$, $Al_yIn_{1-y}As_xSb_{1-x}$/$Al_yIn_{1-y}As$ superlattice, or combinations thereof.

9. The frontside-illuminated barrier infrared photodetector of claim 1, wherein the barrier layer comprises AlAsSb, $(GaSb)_z(LM\text{-}AlAsSb)_{1-z}$, or combinations thereof.

10. The frontside-illuminated barrier infrared photodetector of claim 1, wherein the absorber layer comprises GaSb, $InAs_xSb_{1-x}$/InAs superlattice, $Ga_yIn_{1-y}As_xSb_{1-x}$/$Ga_yIn_{1-y}$ superlattice, $Ga_yIn_{1-y}As_xSb_{1-x}$, $Al_yIn_{1-y}As_xSb_{1-x}$/$Al_yIn_{1-y}As$ superlattice, or combinations thereof.

11. The frontside-illuminated barrier infrared photodetector of claim 1, wherein each of the absorber layer, the barrier layer, and the collector layer have a doping level such that the frontside-illuminated barrier infrared photodetector exhibits photo-voltaic characteristics.

12. The frontside-illuminated barrier infrared photodetector of claim 1, wherein each of the absorber layer, the barrier layer, and the collector layer have a doping level such that the frontside-illuminated barrier infrared photodetector exhibits photo-conductive characteristics.

13. The frontside-illuminated barrier infrared photodetector of claim 1, wherein the collector layer is monolithic across the plurality of pixels.

14. The frontside-illuminated barrier infrared photodetector of claim 1, wherein the collector layer of each pixel is configured as a contact mesa such that a plurality of contact mesas are vertically aligned with the plurality of frontside common electrical contacts.

15. The frontside-illuminated barrier infrared photodetector of claim 1, wherein the plurality of frontside common electrical contacts are configured as a metal grid.

16. The frontside-illuminated barrier infrared photodetector of claim 1, wherein each pixel of the plurality of pixels further comprises a first doped layer between the collector layer and the frontside common electrical contact, and a second doped layer between the absorber layer and the backside electrical contact.

17. A frontside-illuminated barrier infrared photodetector focal plane array comprising:
a transparent carrier substrate;
a plurality of pixels, each pixel comprising an absorber layer, a barrier layer on the absorber layer, a collector layer on the barrier layer, a backside electrical contact coupled to the absorber layer, and a frontside common electrical contact coupled to the collector layer, wherein:
each pixel has a frontside and a backside; and
the absorber layer and the barrier layer are non-continuous across the plurality of pixels; and
the barrier layer of each pixel is closer to a scene than the absorber layer of each pixel;
the frontside common electrical contact of each pixel are electrically coupled to one another; and
the frontside of the plurality of pixels and corresponding frontside common electrical contacts are bonded to the transparent carrier substrate; and
a read-out integrated circuit assembly comprising a read-out integrated circuit substrate and a plurality of electrical contacts, wherein the read-out integrated circuit assembly is bonded to the backside electrical contacts of the plurality of pixels by a plurality of indium bonding bumps.

18. The frontside-illuminated barrier infrared photodetector focal plane array of claim 17, wherein one or more of the absorber layer, the barrier layer, and the collector layer comprises a bulk semiconductor material, a binary semiconductor composition, a ternary semiconductor composition, a quaternary semiconductor composition, a strained layer superlattice composition, or combinations thereof.

19. An infrared sensor device comprising:
a Dewar flask;
an infrared transparent window disposed within the Dewar flask to provide an optical path into the Dewar flask for infrared radiation;
a cold plate disposed within the Dewar flask;
a cooler device thermally coupled to the cold plate by a cold finger, wherein the cooler device is operable to cool the cold plate to an operating temperature;
a frontside-illuminated barrier infrared photodetector focal plane array comprising:
a transparent carrier substrate;
a plurality of pixels, each pixel comprising an absorber layer, a barrier layer on the absorber layer, a collector layer on the barrier layer, a backside electrical contact coupled to the absorber layer, and a frontside common electrical contact coupled to the collector layer, wherein:
each pixel has a frontside and a backside; and
the absorber layer and the barrier layer are non-continuous across the plurality of pixels;
the barrier layer of each pixel is closer to a scene than the absorber layer of each pixel;
the frontside common electrical contact of each pixel are electrically coupled to one another; and
the frontside of the plurality of pixels and corresponding frontside common electrical contacts are bonded to the transparent carrier substrate; and
a read-out integrated circuit assembly comprising a read-out integrated circuit substrate and a plurality of electrical contacts, wherein the read-out integrated circuit assembly is bonded to the backside electrical contacts of the plurality of pixels by a plurality of indium bonding bumps, and the frontside-illuminated barrier infrared photodetector focal plane array is thermally coupled to the cold plate; and a cold shield disposed within the Dewar flask and thermally coupled to the cooler device, wherein the cold shield is arranged to permit desired radiation to be incident on the frontside-illuminated barrier infrared photodetector focal plane array.

* * * * *